(12) United States Patent
Smith

(10) Patent No.: US 6,927,095 B2
(45) Date of Patent: Aug. 9, 2005

(54) LOW COST AND COMPLIANT MICROELECTRONIC PACKAGES FOR HIGH I/O AND FINE PITCH

(75) Inventor: John W. Smith, Horseshoe Bay, TX (US)

(73) Assignee: Tessera, Inc., San Jose, CA (US)

( * ) Notice: Subject to any disclaimer, the term of this patent is extended or adjusted under 35 U.S.C. 154(b) by 23 days.

(21) Appl. No.: 10/658,177

(22) Filed: Sep. 9, 2003

(65) Prior Publication Data

US 2004/0048418 A1 Mar. 11, 2004

Related U.S. Application Data

(62) Division of application No. 09/968,199, filed on Oct. 1, 2001, now Pat. No. 6,707,149.
(60) Provisional application No. 60/237,089, filed on Sep. 29, 2000.

(51) Int. Cl.[7] .......................... H01L 21/44; H01L 21/48; H01L 21/50
(52) U.S. Cl. ........................................ 438/107; 438/455
(58) Field of Search ................................ 438/107, 455, 438/106, 127; 29/825, 827; 257/723, 734, 735, 690, 692, 712, 706, 748, 778, 784, 786

(56) References Cited

U.S. PATENT DOCUMENTS

| | | | |
|---|---|---|---|
| 5,148,265 A | 9/1992 | Khandros et al. | |
| 5,148,266 A | 9/1992 | Khandros et al. | |
| 5,455,390 A | 10/1995 | DiStefano et al. | |
| 5,518,964 A | 5/1996 | DiStefano et al. | |
| 5,688,716 A | 11/1997 | DiStefano et al. | |
| 5,763,941 A | 6/1998 | Fjelstad | |
| 5,801,441 A | 9/1998 | DiStefano et al. | |
| 5,859,472 A | 1/1999 | DiStefano et al. | |
| 5,904,498 A | 5/1999 | Fjelstad | |
| 6,049,972 A | 4/2000 | Link et al. | |
| 6,117,694 A | 9/2000 | Smith et al. | |
| 6,169,328 B1 * | 1/2001 | Mitchell et al. | 257/778 |
| 6,191,368 B1 | 2/2001 | DiStefano et al. | |
| 6,261,863 B1 | 7/2001 | Beroz et al. | |
| 6,338,492 B1 * | 1/2002 | Schilling et al. | 277/630 |
| 6,429,112 B1 * | 8/2002 | Smith et al. | 438/611 |
| 6,472,762 B1 * | 10/2002 | Kutlu | 257/778 |
| 6,525,429 B1 * | 2/2003 | Kovac et al. | 257/778 |
| 6,528,343 B1 * | 3/2003 | Kikuchi et al. | 438/106 |
| 6,590,287 B2 * | 7/2003 | Ohuchi | 257/738 |
| 6,602,740 B1 * | 8/2003 | Mitchell | 438/127 |
| 6,707,149 B2 * | 3/2004 | Smith | 257/723 |
| 2002/0148639 A1 * | 10/2002 | Smith et al. | 174/255 |
| 2003/0168725 A1 * | 9/2003 | Warner et al. | 257/686 |

* cited by examiner

*Primary Examiner*—M. Wilczewski
(74) *Attorney, Agent, or Firm*—Lerner, David, Littenberg, Krumholz & Mentlik, LLP

(57) ABSTRACT

A method of making a compliant microelectronic package includes providing a first substrate having a top surface with conductive pads and an opening extending therethrough to the first substrate so that a bottom surface of the second substrate confronts a top surface of the first substrate. A microelectronic element is attached to the first substrate so that a back face of the microelectronic element confronts the top surface of the first substrate. The contacts of the microelectronic element are electrically interconnected with the conductive pads of the second substrate. A dielectric sheet having conductive leads is juxtaposed with the first substrate. The second ends of the leads are electrically interconnected with the conductive pads of the second substrate, and the dielectric sheet and the second substrate are moved away from one another so as to vertically extend the leads.

28 Claims, 7 Drawing Sheets

LOW COST AND COMPLIANT MICROELECTRONIC PACKAGES FOR HIGH I/O AND FINE PITCH

CROSS-REFERENCE TO RELATED APPLICATIONS

The present application is a divisional of U.S. application Ser. No. 09/968,199 filed Oct. 1, 2001 U.S. Pat. No. 6,707, 149 which claims benefit of U.S. Provisional Application No. 60/237,089 filed Sep. 29, 2000, the disclosures of which are hereby incorporated by reference herein.

FIELD OF THE INVENTION

The present invention relates to microelectronic packages and specifically relates to low cost, compliant packages for high input/output and fine pitch microelectronic elements.

BACKGROUND OF THE INVENTION

Complex microelectronic devices such as semiconductor chips typically require numerous connections to other electronic components. For example, a complex device including a semiconductor chip may require hundreds of electrical connections between the chip and one or more external devices. These electrical connections may be made using several alternative methods, including wire bonding, tape automated bonding and flip-chip bonding. Each of these techniques presents various problems including difficulty in testing the chip after bonding, long lead lengths, large areas occupied by the chip on a microelectronic assembly, and fatigue of the connections due to expansion and contraction of the chip and substrate during thermal cycling.

When a semiconductor chip is mounted to a circuit board, thermal expansion and contraction of the chip and circuit board can cause the contacts on the chip to move relative to contacts on the circuit board. This movement can occur during operation of the device or during manufacturing operations (e.g. when soldering the chip to the circuit board). Thus, in many microelectronic devices, in order to minimize the effects of thermal cycling, it is desirable to provide an electrical connection between components that can accommodate relative movement between the components.

One structure that has been used to successfully address thermal cycling problems is commonly referred to as a connection component such as the structures disclosed in certain preferred embodiments of commonly assigned U.S. Pat. Nos. 5,148,265, 5,148,266 and 5,455,390, the disclosures of which are hereby incorporated by reference herein. Connection components typically include a flexible sheet having a plurality of terminals thereon and flexible leads that are used to electrically interconnect the terminals with contacts on a microelectronic element, such as a semiconductor chip. The flexible leads permit thermal expansion of the microelectronic element and connection component while maintaining the electrical connection between therebetween. The terminals of the connection component may be used to test the package, and/or permanently attach the package to another microelectronic element, such as a printed circuit board. A compliant layer may be disposed between the microelectronic element and the connection component. The compliant layer typically encapsulates the leads and facilitates connection of the terminals to a test device and/or to the final electronic assembly by compensating for variations in component flatness and the heights of the terminals.

In certain preferred embodiments of commonly assigned U.S. Pat. No. 5,518,964 ("the '964 patent"), the disclosure of which is hereby incorporated by reference herein, a microelectronic package is made by first connecting flexible leads between microelectronic elements, such as a chip and a connection component, and then moving the elements away from one another through a predetermined displacement so as to bend the leads. The leads may have first ends permanently attached to the connection component and second ends releasably attached to the connection component. During assembly, the connection component may be juxtaposed with a semiconductor chip having contacts and the second ends of the leads may be bonded to the contacts on the chip. Following bonding, the connection component and chip are moved away from one another, thereby vertically extending the leads. During or after movement, a curable liquid material, such as a silicone elastomer, may be introduced between the elements. The curable material may be cured, such as by using heat, to form a compliant dielectric layer surrounding the leads. The resulting semiconductor chip package has terminals on the connection component which are electrically connected to the contacts on the chip, but which can move relative to the chip so as to compensate for thermal expansion and contraction of the elements during thermal cycling. The package may be mounted to a circuit board by solder-bonding the terminals of the connection component to conductive pads on the circuit board.

In other embodiments of the '964 patent, the package-forming process can be conducted on a wafer scale, so that all of the semiconductor chips in a wafer may be simultaneously connected to connection components. The wafer and connection components may then be moved away from one another so as to vertically extend all of the leads of the wafer in a single step. The resulting package is severed to provide individual units, each including one or more chips electrically interconnected with a portion of a dielectric body. The above-described flexible leads may be formed on the chip or wafer, rather than on the dielectric body. In further embodiments of the '964 patent, a dielectric body having terminals and leads is connected to terminal structures on a temporary sheet. The temporary sheet and dielectric body are moved away from one another so as to vertically extend the leads, and a curable liquid material is introduced around the leads and cured so as to form a compliant layer between the temporary sheet and the dielectric body. The temporary sheet is removed, leaving tip ends of the terminal structures projecting from a surface of the compliant layer. Such a component, commonly referred to as a connection component, may be used between two other components.

In certain preferred embodiments of commonly assigned U.S. Pat. No. 5,688,716, the disclosure of which is hereby incorporated by reference herein, a microelectronic package includes a chip and a package element, such as a heat sink. The chip has contacts electrically interconnected with terminals on a dielectric element, such as a sheet or plate. The dielectric element and chip are then moved away from one another to vertically extend the leads, and a curable liquid material is injected between the package element and dielectric element and around the leads. The dielectric element and the package element extend outwardly beyond the edges of the chip and physically protect the chip.

In certain preferred embodiments of commonly assigned U.S. Pat. No. 6,117,694, the disclosure of which is hereby incorporated by reference herein, a microelectronic package is made by connecting leads between a pair of microelectronic elements and then moving the elements away from one another so as to vertically extend the leads. After vertically extending the leads, a curable encapsulant may be injected between the microelectronic elements. The encapsulant may be injected under pressure for both moving the microelectronic elements away from one another and vertically extending the leads. Alternatively, the leads may be formed by retaining the microelectronic elements against respective platens by vacuum, and then moving the platens away from one another for vertically extending the leads. A curable liquid encapsulant may be injected while the platens maintain the microelectronic elements in their displaced positions.

Despite these and other advances in the art, still further improvements would be desirable. Specifically, there is a need for improved chip packages having high input/output or fine pitch contacts that may be made more easily and more economically.

SUMMARY OF THE INVENTION

A method of making a compliant microelectronic package preferably includes providing a first substrate having a top surface. The first substrate is preferably comprised of a metal or ceramic material. In preferred embodiments, the first substrate is a heat spreader, preferably made of metal or other thermally conductive materials such as aluminum nitride. A second substrate is attached atop the first substrate. The second substrate preferably includes a top surface having a plurality of conductive pads, a bottom surface remote therefrom and an opening extending between the top and bottom surfaces of the second substrate. After the second substrate has been attached to the first substrate, the bottom surface of the second substrate preferably confronts the top surface of the first substrate. The second substrate is preferably attached to the first substrate using an adhesive such as a low expansion adhesive or a non-expansion adhesive. The adhesive may be thermally conductive. In certain preferred embodiments, the first and second substrates have coefficients of thermal expansion that are substantially similar to one another. Although not limited by any particular theory of operation, it is believed that CTE matched substrates will expand and contract at similar rates during operation, thereby minimizing stresses and strains on any electrical interconnections (e.g. leads, wires) therebetween.

The microelectronic element, which is preferably a semiconductor chip having a front contact bearing face and a back face remote therefrom, is placed in the opening of the second substrate. The back face of the microelectronic element may be secured to the top surface of first substrate by using an adhesive. After the microelectronic element has been secured to the first substrate, the front face of the microelectronic element and the top surface of the second substrate are preferably substantially coplanar with one another. The microelectronic element preferably includes semiconductor chips, semiconductor wafers, packaged semiconductor chips and packaged semiconductor wafers, with semiconductor chips and semiconductor wafers being particularly preferred. In other embodiments, the first and second substrates may be replaced with a single, unitary substrate having a cavity for receiving the microelectronic element.

The microelectronic element is electrically interconnected with the conductive pads of the second substrate by, for example, using a wire bonding tool to attached the first ends of conductive wires to the contacts of the microelectronic element and second ends of the conductive wires to the conductive pads of the second substrate. A protective coating may then be provided over at least a portion of the wire bonds to, inter alia, prevent short circuits. In certain preferred embodiments, the bonded conductive wires are flush with the front face of the microelectronic element and the top surface of the second substrate. Although wire bonding is the preferred method for interconnecting the contacts and the conductive pads, other methods known in the art for creating electrical interconnections may also be used.

A dielectric sheet, such as a flexible dielectric film, may be juxtaposed with the top surface of the second substrate. In preferred embodiments, the dielectric sheet includes a flexible polymeric sheet. The dielectric sheet may be flexible or rigid. The dielectric sheet may be a polymeric dielectric sheet and more preferably is a flexible, polymeric dielectric sheet. The dielectric sheet may have conductive elements exposed at the second surface. In embodiments where the dielectric sheet is rigid, the dielectric sheet may be a ceramic plate, a FR4 or FR5 or bismaleimide triazine board (BT) or a multi-layer substrate. In embodiments where the dielectric sheet is flexible, the dielectric sheet is preferably polymeric, the preferred polymeric sheet including a polyimide.

The dielectric sheet preferably includes conductive leads having first ends permanently attached to the dielectric sheet and second ends releasably attached to the dielectric sheet. The dielectric sheet preferably has a first surface including the conductive leads extending over the first surface and terminals accessible at the second surface thereof. The terminals are desirably electrically interconnected with the first ends of the leads. After the dielectric sheet has been juxtaposed with the front face of the microelectronic element, the releasable ends of the leads are attached to the conductive pads of the second substrate for electrically interconnecting the leads with the contacts of the microelectronic element. As a result, the contacts of the microelectronic element are electrically interconnected with the terminals accessible at the second surface of the dielectric sheet. The releasable ends of the leads may be attached to the conductive pads using a conductive paste or a conductive adhesive. In other embodiments, the releasably ends of the leads are not attached to the substrate. In still other embodiments, a gap is present between the releasable ends of the leads and the dielectric substrate and a small spot of dielectric material may span the gap, the small spot connecting the releasable end to the substrate.

The dielectric film and the second substrate are then moved away from one another in a controlled manner so as to move the second ends of the leads away from the dielectric film, and to vertically extend the leads between the second substrate and the dielectric film. In certain preferred embodiments, the moving step includes introducing a liquid material between the dielectric film and the second substrate. As the liquid material is introduced, the curable liquid material forces the dielectric film away from the second substrate. The curable material is preferably a material having a low coefficient of thermal expansion. The liquid material may be cured so as to form a compliant layer between the dielectric film and the second substrate and microelectronic element. The curable liquid material may be cured at room temperature or by using energy or heat. Fusible conductive masses, such as solder balls, may be attached to the terminals of the dielectric film so that the assembly may be readily interconnected with the contacts of another component.

In one preferred embodiment, the dielectric film and the second substrate are moved relative to one another through a predetermined displacement so that the dielectric film moves with both a vertical component of motion away from the second substrate and a horizontal component of motion parallel to the second substrate, wherein the conductive leads are bent into a substantially S-shape configuration. In one particular preferred embodiment, the dielectric film and second substrate are moved away from one another by attaching a top platen to the dielectric film and a bottom platen to the first substrate, drawing a vacuum through the first platen so as to adhere the dielectric film to the first platen and drawing a vacuum through the second platen so as to adhere the first substrate to the second platen. While maintaining the vacuum through the first and second platens, the first and second platens are moved away from one another. As the first and second platens move away from one another, in turn, the dielectric film and second substrate move away from one another. During this time, the first releasable ends of the leads are released or peeled away from the first surface of the dielectric film and bent into a substantially S-shape orientation.

Although the present invention is not limited by any particular theory of operation, it is believed that mounting the back face of a microelectronic element to a top surface of a first substrate using an adhesive, and then using a wire bonding tool to electrically interconnect the contacts of the microelectronic element with the conductive pads of a second substrate avoids the need for costly and time consuming accurate mounting of the microelectronic element relative to the first and second substrates. Furthermore, such a package may be made rather simply and at low cost and use a gang lead forming process for electrically interconnecting the microelectronic element with terminals of a dielectric film, wherein the leads extend between the conductive pads of the second substrate and the terminals of the dielectric film. Thus, the present invention provides improved methods for manufacturing microelectronic assemblies having high input/output and fine pitch contacts using economical materials. The present invention also avoids the need for precise chip mounting tools.

In other preferred embodiments of the present invention, a method of making compliant microelectronic packages includes providing a first substrate having a top surface, and providing a second substrate having a top surface with a plurality of conductive pads, a bottom surface, and a plurality of openings extending between the top and bottom surfaces. The second substrate is attached to the first substrate so that the bottom of the second substrate confronts the top of the first substrate. Microelectronic elements are then disposed in the plurality of openings of the second substrate, each microelectronic element having a front face with contacts and a back face remote therefrom, whereby the back face of each microelectronic element confronts the top surface of the first substrate. The contacts of the microelectronic elements are then electrically interconnected with the conductive pads of the second substrate. One preferred method includes using a wire bonding tool to form conductive wire bonds between the contacts and the conductive pads. A dielectric film having leads is then juxtaposed with the second substrate and the microelectronic elements, the conductive leads having first ends permanently attached to the dielectric film and the second ends releasably attached to the dielectric film. The second ends of the leads are then attached to the conductive pads of the second substrate so as to electrically interconnect the leads with the contacts of the microelectronic elements. The dielectric film and the second substrate are moved away from one another so as to vertically extend the leads between the dielectric film and the second substrate. A curable liquid encapsulant, may be disposed between the dielectric film and the second substrate so as to provide a compliant layer therebetween. The resulting assembly may be severed to provide individual microelectronic packages including one or more microelectronic elements and a portion of the dielectric substrate.

In accordance with yet another preferred embodiment of the present invention, a microelectronic package includes a first substrate having a top surface, and a second substrate having a top surface including a plurality of conductive pads, a bottom surface remote therefrom and an opening extending between the top and bottom surfaces, whereby the second substrate is attached to the first substrate so that the bottom surface of the second substrate confronts the top surface of the first substrate. A microelectronic element having a front face with contacts and a back face remote therefrom is disposed in the opening of the second substrate and attached to the first substrate, the back face of the microelectronic element confronting the top surface of the first substrate. The conductive pads of the second substrate are preferably electrically interconnected with the contacts of the microelectronic element, such as by using conductive wires.

The package also preferably includes a dielectric sheet overlying the second substrate and the microelectronic element disposed within the opening of the second substrate, the dielectric film including leads vertically extended between the second substrate and the dielectric film for electrically interconnecting the microelectronic element and the dielectric sheet. The vertically extended leads may have an S-shape so that the leads flex and bend during thermal cycling of the components. The package also preferably includes a compliant layer between the dielectric sheet and the second substrate and around the leads. The dielectric film may have terminals exposed at a top surface thereof, the terminals being electrically interconnected with the leads. Masses of fusible conductive material may be deposited atop the terminals. The masses of fusible conductive material may include material selected from the group consisting of tin, lead and combinations thereof.

These and other preferred embodiments of the present invention will be described in more detail below.

DETAILED DESCRIPTION OF PREFERRED EMBODIMENTS

Figure 1:
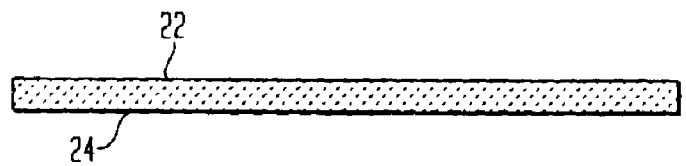
FIGS. 1–9 show a method of making a microelectronic package, in accordance with certain preferred embodiments of the present invention.
Figure 2:
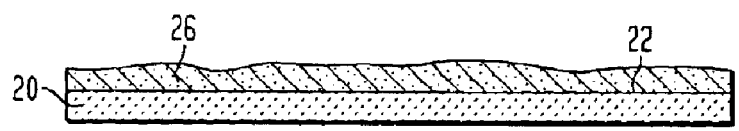

Referring to FIG. 1, in accordance with certain preferred embodiments of the present invention, a first substrate 20 has a top surface 22 and a bottom surface 24 remote therefrom. The first substrate 20 is preferably substantially flat whereby the top and bottom surfaces 22, 24 are substantially parallel with one another. Preferred materials for the first substrate 20 include ceramic or aluminum nitride. The first substrate may be used as a conductive heat spreader, as will explained in more detail below. Referring to FIG. 2, a curable material, such as an adhesive 26 is then preferably deposited over the top surface 22 of first substrate 20. The adhesive is preferably curable, and may be a rigid adhesive or a thermally conductive adhesive.

Figure 3A:
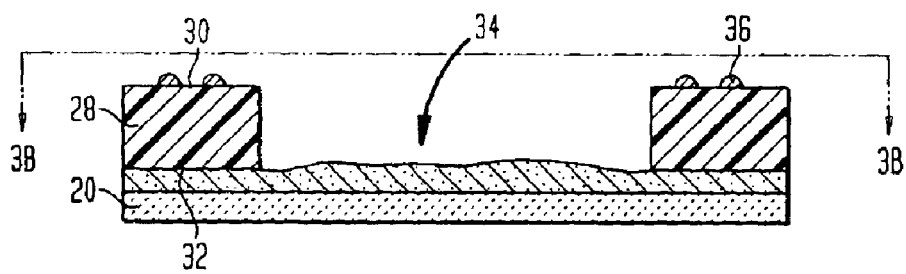
Figure 3B:
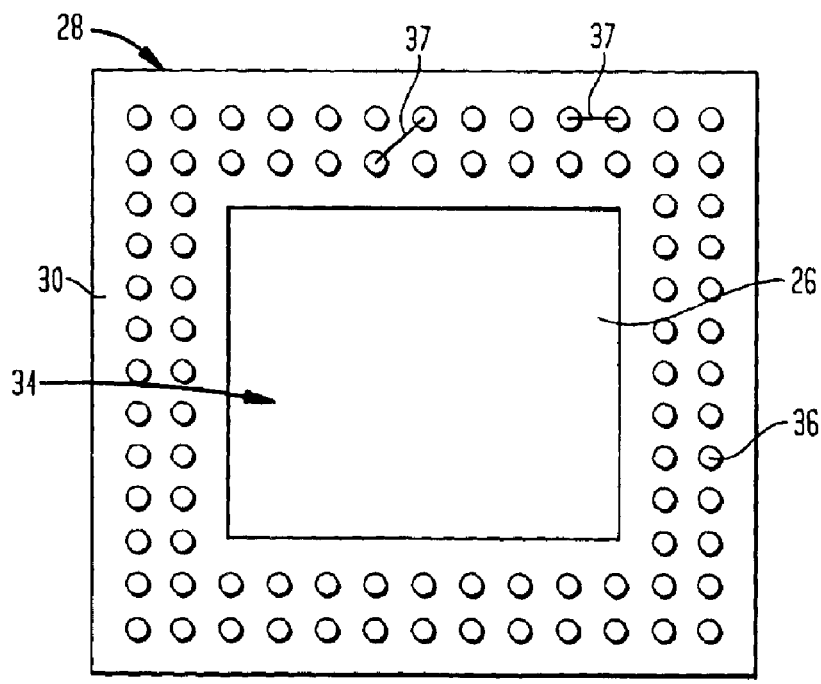

Referring to FIGS. 3A and 3B, a second substrate 28, such as FR4, FR5, BT, circuitized polyimide or a multi-layer substrate, includes a top surface 30 and a bottom surface 32 therefrom. The second substrate 28 includes a central opening 34 extending between the top and bottom surfaces 30, 32. Conductive pads 36 are accessible at the top surface 30 of second substrate 28. Some of the conductive pads may be interconnected with adjacent conductive pads by traces 37 extending over top surface 30. In other embodiments, the second substrate may have leads with first ends permanently secured to the second substrate and second ends releasably secured to the substrate.

Figure 4A:
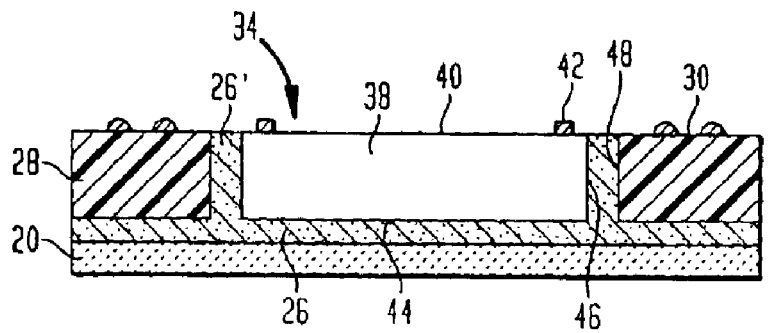
Figure 4B:
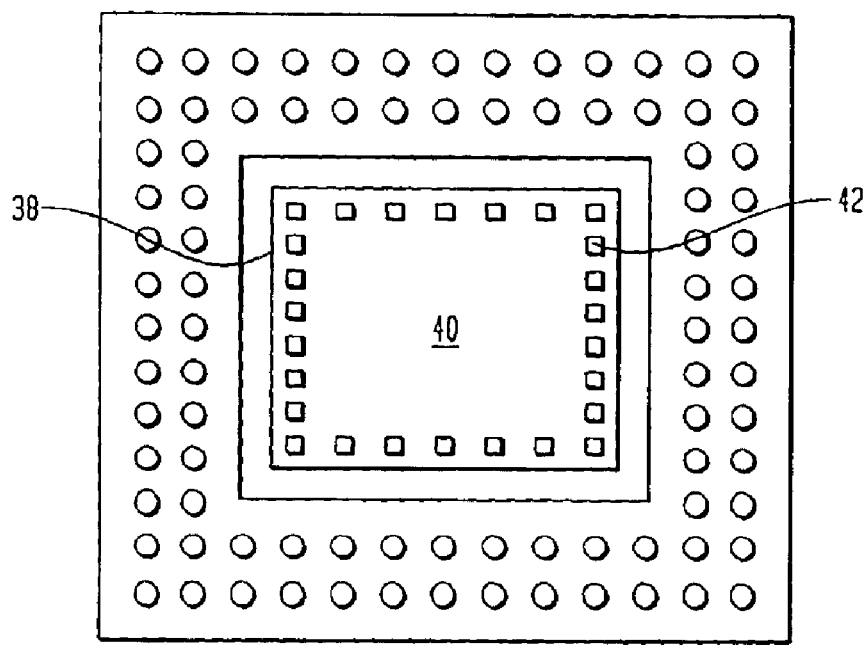

Referring to FIGS. 4A and 4B, a microelectronic element 38, such as a semiconductor chip, is then secured over the first substrate 20. The semiconductor chip 38 includes a front face 40 having contacts 42 and a back face 44 remote from front face 40. During assembly, semiconductor chip 38 is placed in alignment with central opening 34 of second substrate 28. Semiconductor chip 38 is then disposed in central opening 34 and back face 44 is abutted against adhesive 26. A portion of adhesive 26 may extend between an outer perimeter 46 of chip 38 and an inner perimeter 48 of the second substrate 28. The portion of the adhesive extending between chip 38 and the second substrate 28 is designated adhesive portion 26'. As mentioned above, chip 38 is not required to be precisely mounted in the central opening 34 of second substrate 28. Thus, a tool for precisely mounting chips or other types of microelectronic elements is not required.

Referring to FIG. 4B, semiconductor chip 38 includes front face 40 having a plurality of peripheral contacts 42. Referring to FIG. 4A, after semiconductor chip 38 has been secured to first substrate 20, the front face 40 of semiconductor chip 38 is preferably substantially coplanar with top surface 30 of second substrate 28.

Figure 5A:
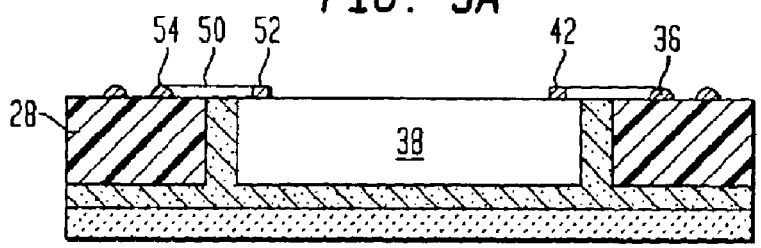
Figure 5B:
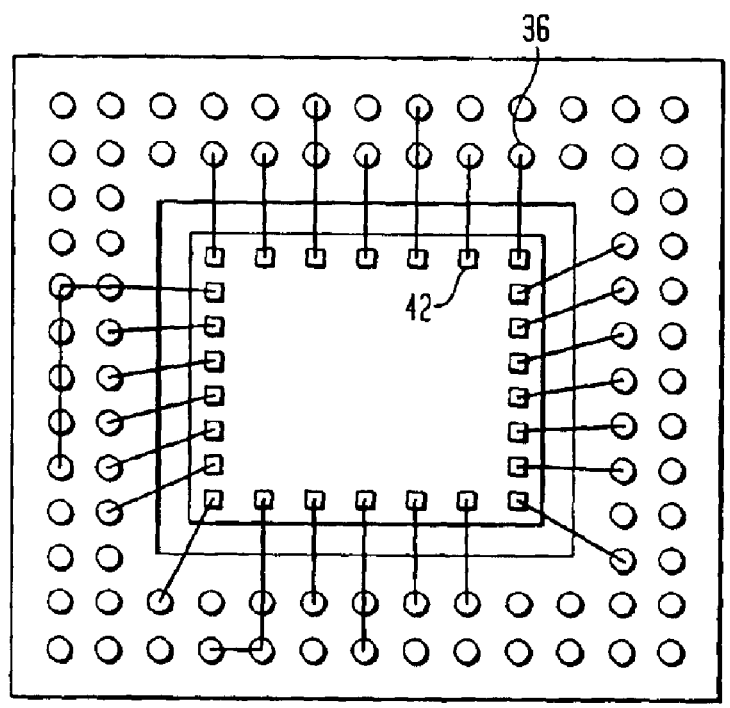

Referring to FIGS. 5A and 5B, the contacts 42 of semiconductor chip 38 are then preferably electrically interconnected with at least some of the conductive pads 36 of second substrate 28. One preferred method for electrically interconnecting the contacts 42 and conductive pads 36 is to use a wire bonding tool that provides conductive wires 50 having first ends 52 bonded to contacts 42 and second ends 54 bonded to conductive pads 36. Referring to FIG. 5B, such a preferred method for interconnecting contacts 42 and conductive pads 36 provides a fan-out arrangement. Such fan-out semiconductor chip assemblies are disclosed in certain preferred embodiments of commonly assigned U.S. Pat. No. 5,688,716, the disclosure of which is hereby incorporated by reference herein.

Figure 6:
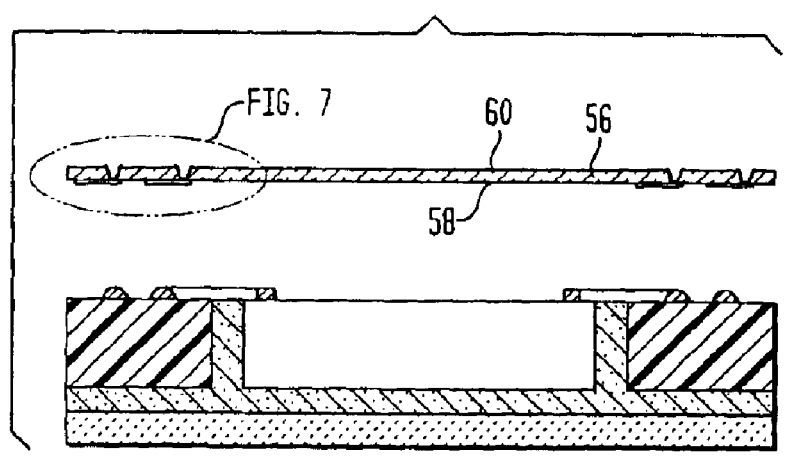
Figure 7:
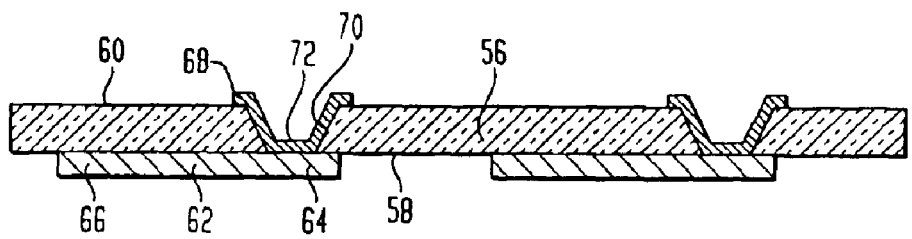

Referring to FIGS. 6 and 7, a flexible substrate 56, such as a flexible dielectric film, includes a first surface 58 and a second surface 60 remote therefrom. The dielectric film 56 may be secured to a carrier frame (not shown), such as that disclosed in commonly assigned U.S. Pat. No. 6,049,972, the disclosure of which is hereby incorporated by reference herein. Referring to FIG. 7, the dielectric film 56 includes a plurality of flexible, conductive leads 62 formed on the first surface 58 of dielectric film 56. The flexible conductive leads 62 may be made from a wide variety of conductive materials, including gold, aluminum, copper and their alloys and combinations thereof. Each conductive lead 62 desirable includes a first end 64 that is permanently secured to the dielectric film 56 and a second end 66 that is releasably secured to dielectric film 56. The conductive lead 62 may have many different shapes and/or designs such as those disclosed in commonly assigned U.S. Pat. No. 5,518,964, as well as in commonly assigned U.S. Pat. Nos. 5,859,472 and 6,191,368, the disclosure of which are hereby incorporated by reference herein. Dielectric film 56 includes terminals 68 accessible at the second surface 60 of dielectric film 56. Terminal 68 may include metallized vias 70 extending between the second surface 60 and the first surface 58 of dielectric film 56. A bottom portion 72 of metallized via 70 preferably forms an intermetallic bond with the permanently secured end 64 of conductive lead 62.

Figure 8:
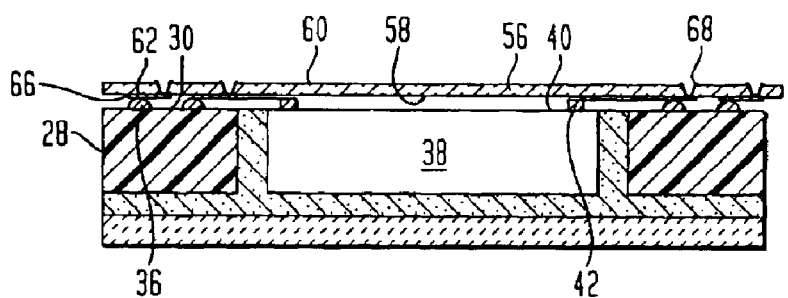

Referring to FIG. 8, the first surface 58 of dielectric film 56 is preferably juxtaposed with the top surface 30 of second substrate 28 and the front face 40 of semiconductor chip 38. The second ends 66 of conductive leads 62 are then electrically interconnected with the conductive pads 36 of second substrate 28. A conductive paste or adhesive (not shown) may be provided between the second ends 66 of conductive leads 62 and top surfaces of conductive pads 36 for attaching conductive leads 62 to conductive pads 36. After conductive leads 62 have been bonded to conductive pads 36, contacts 42 of chip 38 are electrically interconnected with terminal 68 at second surface 60 of dielectric film 56.

In order to provide releasable leads, adhesion between dielectric film 56 and the second ends 66 of leads 62 may be reduced by using the methods disclosed in commonly assigned U.S. Pat. Nos. 5,763,941; 5,904,498; and 6,261,863; and U.S. patent application Ser. Nos. 09/020,750; 09/200,100; 09/225,669; 09/290,975; and 09/317,675, the disclosures of which are hereby incorporated by reference herein. For example, prior to forming conductive leads 62 atop dielectric film 56, an adhesive reducing substance such as silicone may be provided over the first surface 58 of dielectric film 56 for reducing the level of adhesive between leads 62 and dielectric film 56. However, in preferred embodiments wherein the dielectric film is made of polymeric material, there may be no need to take affirmative steps to enhance peelability between leads 62 and dielectric film 56, because poor adhesive generally results between metal and polymeric materials. In other preferred embodiments, steps normally taken in the manufacture of the substrate to improve the adhesion between the substrate and the leads may be omitted.

Figure 9:
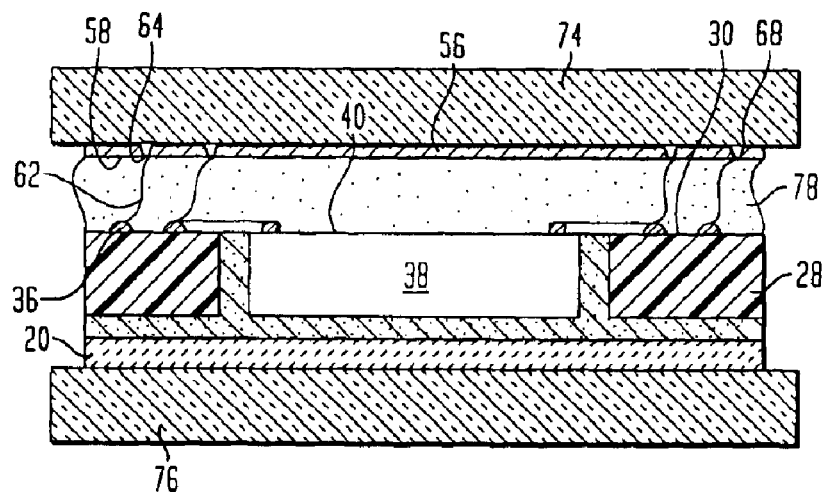

Referring to FIG. 9, after leads 62 are attached to conductive pads 36, the dielectric film 56 may be moved away from second substrate 28 and semiconductor chip 38 through a controlled displacement using an upper platen 74 abutted against dielectric film 56 and a lower platen 76 abutted against first substrate 20. As disclosed in certain preferred embodiments of commonly assigned U.S. Pat. No. 5,801,441, the disclosure of which is hereby incorporated by reference herein, a vacuum is preferably applied through upper platen 74 for firming holding dielectric film 56 and through lower platen 76 for firming holding first substrate 20. The upper and lower platens 74, 76 are then moved away from one another in a substantially vertical or in both vertical and horizontal directions. During the controlled movement of upper and lower platens 74, 76, the second ends 66 of leads 62 are released from first surface 58 of dielectric film 56, while the first ends 64 remain fixed to dielectric film 56. In addition, leads 62 preferably deform and/or bend in a direction away from dielectric film 56 and the first ends 64 of leads 62. The resulting leads are preferably flexible.

The net effect of the movement of dielectric film 56 and second substrate 28 is to move the second ends 66 of leads 62 vertically away from and horizontally toward the second ends 64 of the same leads, thus forming each lead into the S-shaped lead 62 shown in FIG. 9. Such lead structure is able to flex and bend so as to compensate for movement of dielectric film 56 and second substrate 28 relative to one another during thermal cycling of the microelectronic package.

After leads 62 have been vertically extended, a curable liquid material 78, such as a low modulus encapsulant may be introduced between dielectric film 56 and the front face 40 of semiconductor chip 38 and the top surface 30 of second substrate 28. The curable liquid encapsulant 78 preferably extends between dielectric film 56 and second substrate 28/chip 38. The curable liquid encapsulant 78 also surrounds the flexible leads 62 extending between second substrate 28 and dielectric film 56. In preferred embodiments, the curable liquid encapsulant 78 provides a compliant layer between dielectric film 56 and second substrate 28/chip 38. The compliant layer 78 allows movement of the terminals 68 relative to conductive pads 36, while maintaining an electrical interconnection therebetween via flexible conductive leads 62.

Preferred methods for introducing a curable liquid encapsulant between microelectronic elements are disclosed in certain preferred embodiments of commonly assigned U.S. Pat. No. 5,801,441, the disclosure of which is hereby incorporated by reference herein. In preferred embodiments of the present invention, the encapsulant has a low viscosity and is introduced in an uncured state. The encapsulant may wet to the dielectric film 56, chip 38 and second substrate 28, and effectively fills a gap therebetween. The encapsulant may be rigid or compliant when cured. In certain preferred embodiments, the encapsulant is preferably selected so that it forms a compliant layer upon being cured. Preferred encapsulants includes silicones, silicone elastomers, silicone gels, flexilized epoxies and epoxies. In some preferred embodiments, the encapsulant around the leads 62 is rigid and the remainder of the encapsulant between the semiconductor chip 38/second substrate 28 and dielectric film 56 is compliant. In other preferred embodiments, the encapsulant around leads 62 is compliant and the remainder of the encapsulant is rigid. In other embodiments the package may include compliant pads made of silicone and the encapsulant may be an epoxy, as disclosed in the above-mentioned U.S. Pat. No. 6,261,863.

In its liquid state, the encapsulant may be injected under pressure. The encapsulant may also be injected without external pressure and allowed to fill the gap between the components by capillary action. After being disposed between dielectric film 56 and chip 38/second substrate 28, the encapsulant is preferably cured in placed. Depending upon the formulation of the encapsulant, such curing may take place spontaneously at room temperature or may require exposure to energy, such as heat or radiant energy.

Figure 10:
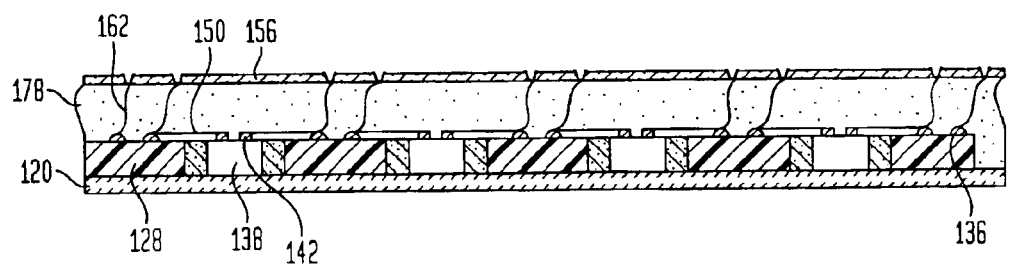
FIGS. 10–11 show a method of making a plurality of microelectronic packages, in accordance with further preferred embodiments of the present invention.
Figure 11:
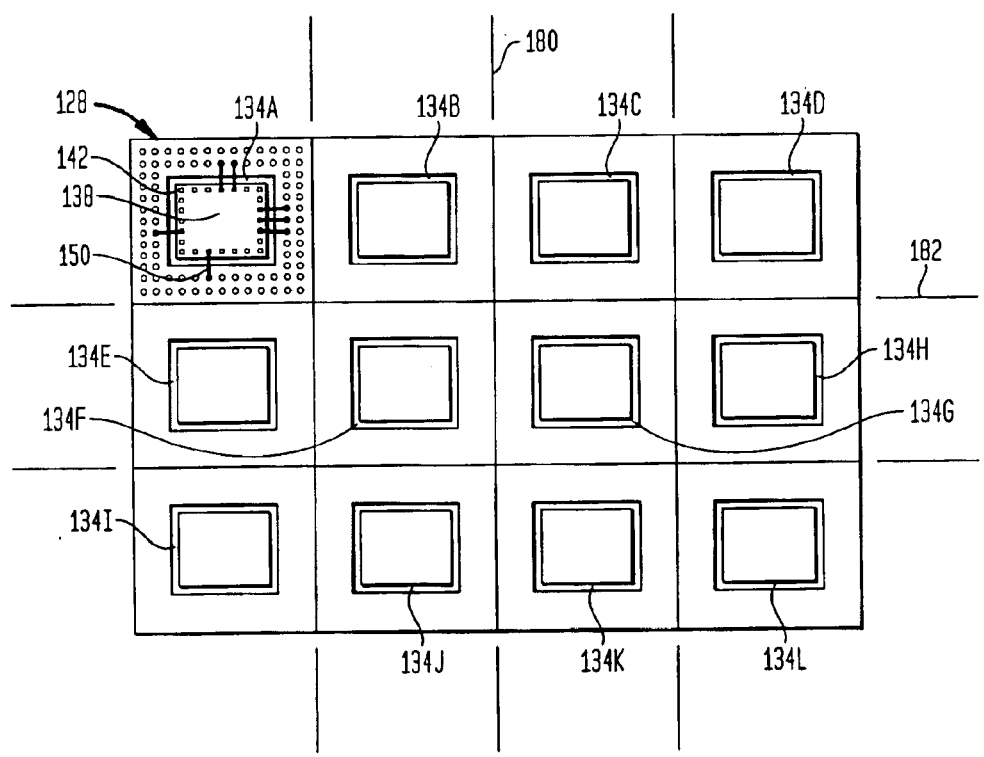

Referring to FIGS. 10 and 11, another preferred embodiment of the present invention, a microelectronic package includes a first substrate 120 and a second substrate 128 formed atop first substrate 120. Second substrate 128 includes a plurality of openings designated 134A–134L. As shown in FIG. 10, microelectronic elements 138 are then disposed in each of the openings 134. In some preferred embodiments, the microelectronic elements may be placed in only some of the openings. The microelectronic elements 138 have peripheral contacts 142 that are electrically interconnected with conductive pads 136 of substrate 128 via conductive wires 150.

Referring to FIG. 11, after chips 138 are electrically interconnected with second substrate 128, a dielectric film 156 substantially similar to that described above is juxtaposed with the chips 134 disposed in the openings of second substrate 128. The conductive leads 162 of dielectric film 156 are connected to the conductive pads 136 of second substrate. A curable liquid encapsulant 178 may then be disposed between the dielectric film 156 and the second substrate 128 so as to move the dielectric film 156 and second substrate 128 away from one another and so as to vertically extend leads 162. The curable dielectric materials is then cured to provide a compliant layer between dielectric film 156 and second substrate 128. The contacts 142 may be electrically interconnected with dielectric sheet 156 by vertically extended leads extending between the contacts and the dielectric sheet. Referring to FIG. 10, second substrate 128 and first substrate 120 may be severed to provide individual compliant microelectronic packages, each package including one or more chips 138. In one embodiment, second substrate 128 is severed along streets 180 and alleys 182 to provide individual microelectronic packages.

Figure 12:
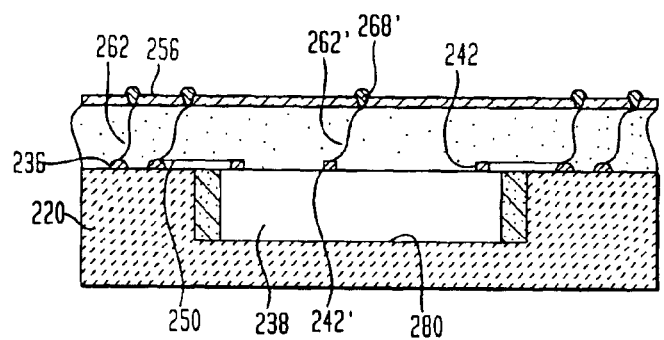
FIG. 12 shows a microelectronic package, in accordance with other preferred embodiments of the present invention.

Referring to FIG. 12, in another preferred embodiment of the present invention, the first and second substrates shown in FIG. 3A are replaced with a unitary substrate 220 having a cavity 280 adapted to receive microelectronic element 238. Unitary substrate 220 includes conductive pads 236 and microelectronic element 238 includes contacts 242. Some of the contacts 242 are electrically interconnected with some of the conductive pads 236 using conductive wires 250. In addition, the conductive pads 236 and contacts 242 may be electrically interconnected with dielectric sheet 256 by flexible leads 262. As shown in FIG. 12, at least one of the contacts 242' is directly connected to a terminal 268' of dielectric sheet 256 by conductive lead 262' extending between microelectronic element 238 and dielectric sheet 256.

Figure 13:
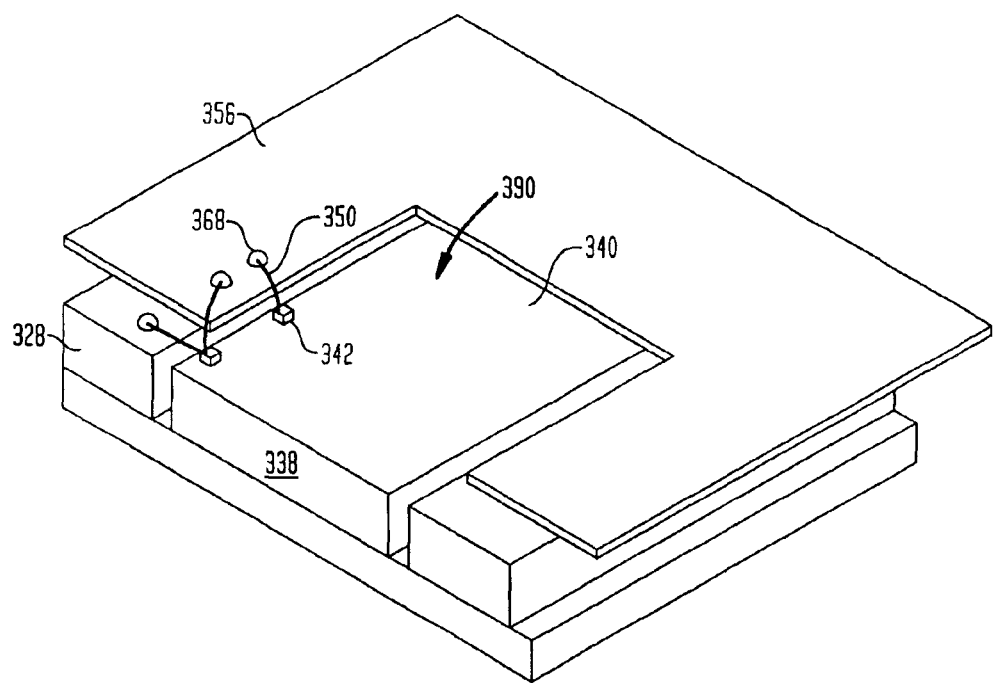
FIG. 13 shows a microelectronic package, in accordance with still other preferred embodiments of the present invention.

Referring to FIG. 13, in another preferred embodiment of the present invention, dielectric sheet 356 has a central opening 390 so that when the dielectric sheet is positioned above microelectronic element 338, the central opening 390 is in general alignment with the contact bearing surface 340 of microelectronic element 338. Dielectric sheet 356 includes one or more terminals 368 that may be electrically interconnected with contacts 342 of microelectronic element 338 by passing conductive wires 350 through the central opening 390 of dielectric sheet 356. A curable liquid material (not shown) may be disposed between the dielectric sheet 356 and substrate 328. The curable liquid material may be cured to provide a compliant layer between the dielectric sheet 356 and substrate 328.

Figure 14:
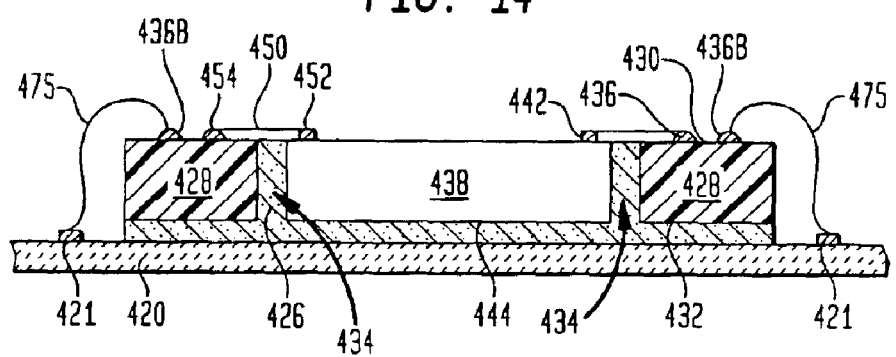
FIG. 14 shows a cross-sectional view of a microelectronic package, in accordance with yet another preferred embodiment of the present invention.

FIG. 14 shows a microelectronic package in accordance with another preferred embodiment of the present invention. The package includes a first substrate 420 having conductive pads 421 on a top surface thereof. A curable material 426, such as an adhesive, is preferably deposited over first substrate 420. A second substrate 428, such as FR4, FR5, BT, circuitized polyimide or a multi-layer substrate has a top surface 430 and a bottom surface 432 remote therefrom. The second substrate 428 includes a central opening 434 extending between the top and bottom surfaces 430, 432. Conductive pads 436 are accessible at top surface 430 of second substrate 428. Some of the conductive pads 436 may be interconnected with outer conductive pads 436b by traces (not shown) extending over top surface 430.

A microelectronic element 438, such as a semiconductor chip, is secured in central opening 434 of second substrate 428 and over top surface of first substrate 420. The semiconductor chip includes contacts 442 on a contact bearing surface thereof and a rear surface 444 remote from the contact bearing surface. During assembly, semiconductor chip 438 is placed within central opening 434 of second substrate 428. In certain preferred embodiments, second substrate 428 and first substrate 420 have a Coefficient of Thermal Expansion (CTE) that is substantially similar, whereby the first and second substrates 420, 428 are deemed to be CTE matched. In other words, the first and second substrates 420, 428 generally expand and contract at similar rates as the elements are heated up and cooled down during operation of the package.

As semiconductor chip 438 is disposed in central opening 434, rear surface 444 thereof is preferably abutted against adhesive 426. A portion of adhesive 426 may extend between outer edges of chip 438 and the inner edges of second substrate 428.

The contacts 442 of semiconductor chip 448 are preferably electrically interconnected with at least some of the conductive pads 436 of second substrate 428. One preferred method for electrically interconnecting contacts 428 with conductive pads 436 is by using a wire bonding tool that provides conductive wires 450 having inner ends 452 bonded to contacts 442 and outer ends 454 bonded to conductive pads 436. Second substrate 428 may in turn be electrically interconnected with first substrate 420 by wire bonding one or more outer contact pads 436b to first substrate conductive pads 421 using conductive wires 475. Although the present invention is not limited by any particular theory of operation, it is believed that providing CTE matched first and second substrates 420, 428 increases the reliability of the electrical interconnections by minimizing stresses and strains on conductive wires 450 and 475 during operation of the microelectronic package.

Although the present invention has been described with reference to certain preferred embodiments, the various embodiments disclosed herein are merely illustrative of principles and applications of the present invention. Thus, it is to be understood that numerous modifications and changes may be made to the preferred embodiments disclosed herein, and that other arrangements may be produced, without departing from the spirit and scope of the present invention as to defined by the claims.

What is claimed is:

1. A method of making a microelectronic package comprising:

providing a first substrate having a top surface;

providing a second substrate having a top surface including a plurality of conductive pads, a bottom surface remote therefrom and an opening extending between the top and bottom surfaces, and attaching said second substrate to said first substrate so that the bottom surface of said second substrate confronts the top surface of said first substrate;

placing a microelectronic element having a front face with contacts and a back face remote therefrom in the opening of said second substrate and securing said microelectronic element to said first substrate so that the back face of said microelectronic element confronts the top surface of said first substrate;

electrically interconnecting the contacts of said microelectronic element with the conductive pads of said second substrate;

juxtaposing a dielectric sheet having conductive leads with said second substrate, said conductive leads having first ends permanently attached to said dielectric sheet and second ends opposite the first ends;

electrically interconnecting the second ends of said leads to the conductive pads of said second substrate so as to electrically interconnect said leads with said contacts of said microelectronic element; and moving said dielectric sheet and said second substrate away from one another so as to vertically extend said leads between said dielectric sheet and said second substrate.

2. The method as claimed in claim 1, wherein the moving step includes introducing a curable liquid material between said dielectric sheet and said second substrate.

3. The method as claimed in claim 2, wherein the introducing a curable liquid material step includes injecting the curable liquid material under pressure so as to force said dielectric sheet away from said second substrate and said microelectronic element during the moving step.

4. The method as claimed in claim 2, further comprising curing the curable liquid material to form a compliant layer.

5. The method as claimed in claim 4, wherein said compliant layer is between said dielectric sheet and said second substrate.

6. The method as claimed in claim 1, wherein the step of electrically interconnecting the contacts with the conductive pads includes attaching first ends of conductive wires to the contacts of said microelectronic element and second ends of the conductive wires to the conductive pads of said second substrate.

7. The method as claimed in claim 1, wherein said dielectric sheet has a first surface including said conductive leads and a second surface having terminals accessible at the second surface, said terminals being electrically interconnected with the first ends of said leads.

8. The method as claimed in claim 1, further comprising attaching fusible conductive masses to the terminals of said dielectric sheet.

9. The method as claimed in claim 1, wherein the electrically interconnecting step includes attaching the second ends of said leads to the conductive pads of said second substrate before the moving step.

10. The method as claimed in claim 1, wherein the moving step includes moving said dielectric sheet and said second substrate relative to one another through a predetermined displacement so that said dielectric sheet moves with a vertical component of motion away from the second substrate and the microelectronic element, wherein said leads are vertically extended.

11. The method as claimed in claim 1, wherein the front face of said microelectronic element and the top surface of said second substrate are substantially coplanar after said microelectronic element has been attached to said first substrate.

12. The method as claimed in claim 1, wherein said second substrate is attached to said first substrate using an adhesive.

13. The method as claimed in claim 12, wherein said adhesive includes a material having a low coefficient of expansion.

14. The method as claimed in claim 13, wherein said low coefficient of expansion material is an epoxy.

15. The method as claimed in claim 12, wherein said adhesive is a thermally conductive adhesive.

16. The method as claimed in claim 1, wherein said first substrate is thermally conductive.

17. The method as claimed in claim 1, wherein said first substrate is made of a material selected from the group consisting of ceramic and aluminum nitride.

18. The method as claimed in claim 1, wherein said second substrate is selected from the group consisting of FR4 and bismaleimide triazine boards.

19. The method as claimed in claim 1, wherein the attaching said microelectronic element step includes providing an adhesive over the top surface of said first substrate and abutting the back face of said microelectronic element against the adhesive applied to said first substrate.

20. The method as claimed in claim 1, wherein said microelectronic element is selected from the group consisting of semiconductor chips and semiconductor wafers.

21. The method as claimed in claim 1, wherein the electrically interconnecting the contacts and conductive pads step includes attaching first ends of conductive wires to said contacts and second ends of said conductive wires to said conductive pads.

22. The method as claimed in claim 21, wherein the attaching first and second ends of conductive wires step includes using a wire bonding tool.

23. The method as claimed in claim 1, wherein said dielectric sheet is flexible.

24. The method as claimed in claim 1, wherein said dielectric sheet is rigid.

25. The method as claimed in claim 1, wherein the moving step comprises:

attaching a top platen to said dielectric sheet and a bottom platen to said first substrate; and moving said first and second platens away from one another.

26. The method as claimed in claim 25, wherein the attaching a top platen and a bottom platen step includes drawing a vacuum through said top and bottom platens.

27. The method as claimed in claim 1, wherein the second ends of said leads are peeled away from the first surface of said dielectric sheet during the moving step.

28. The method as claimed in claim 1, wherein said first and second substrates have coefficients of thermal expansion that are substantially similar to one another for minimizing stress and strain on said leads.

\* \* \* \* \*